US007153539B2

(12) United States Patent
Sadasivan et al.

(10) Patent No.: US 7,153,539 B2
(45) Date of Patent: Dec. 26, 2006

(54) APPARATUS AND METHOD OF COLOR TUNING A LIGHT-EMITTING DISPLAY

(75) Inventors: Sridhar Sadasivan, Rochester, NY (US); Ramesh Jagannathan, Rochester, NY (US); Seshadri Jagannathan, Pittsford, NY (US); David J. Nelson, Rochester, NY (US); Rajesh V. Mehta, Rochester, NY (US); Glen C. Irvin, Jr., Rochester, NY (US); Thomas N. Blanton, Rochester, NY (US); Robert S. Cupello, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/602,429

(22) Filed: Jun. 24, 2003

(65) Prior Publication Data

US 2004/0265478 A1 Dec. 30, 2004

(51) Int. Cl.
*B05D 5/12* (2006.01)

(52) U.S. Cl. ............................ 427/66; 427/68; 427/64

(58) Field of Classification Search .................. 427/66, 427/68

See application file for complete search history.

(56) References Cited

U.S. PATENT DOCUMENTS 4,734,227 A 3/1988 Smith
5,059,863 A * 10/1991 Tashiro et al. .............. 313/504
5,294,869 A 3/1994 Tang et al.
5,294,870 A 3/1994 Tang et al.
5,684,365 A 11/1997 Tang et al.
5,972,419 A 10/1999 Roitman et al.
6,116,718 A 9/2000 Peeters et al.
6,420,834 B1 * 7/2002 Yamazaki et al. ....... 315/169.3
6,471,327 B1 * 10/2002 Jagannathan et al. ......... 347/21
2001/0001050 A1 * 5/2001 Miyashita et al. .......... 428/690
2003/0054957 A1 3/2003 Irvin et al.

FOREIGN PATENT DOCUMENTS

EP 1 093 156 4/2001
EP 1 093 167 4/2001
EP 1 318 021 6/2003
WO WO 02/45868 6/2002

* cited by examiner

*Primary Examiner*—Timothy Meeks
*Assistant Examiner*—David Turocy
(74) *Attorney, Agent, or Firm*—William R. Zimmerli

(57) ABSTRACT

An apparatus and method of color tuning a light emitting display are provided. The apparatus includes a source of a mixture of a compressed fluid solvent and an organic material. A discharge device is positioned in fluid communication with the source of the mixture of the compressed fluid and the organic material. A condition controlling device is positioned in fluid communication between the source and the discharge device. The method includes providing a substrate, providing a first addressing electrode on the substrate, controllably depositing an organic nanomorphic material over the first addressing electrode, and providing a second addressing electrode over the organic nanomorphic material.

23 Claims, 9 Drawing Sheets

APPARATUS AND METHOD OF COLOR TUNING A LIGHT-EMITTING DISPLAY

CROSS REFERENCE TO RELATED APPLICATIONS

Reference is made to the following commonly assigned U.S. patent applications: U.S. patent application Ser. No. 10/602,134, entitled "A Light Emitting Display" filed Jun. 24, 2003, in the name of Sadasivan et at.; U. S. patent application Ser. No. 10/602,840, entitled "An Apparatus and Method Of Producing Multiple Spectral Deposits From A Mixture Of A Compressed Fluid and A Marking Material" filed Jun. 24, 2003, in the name of Nelson et at.; and U. S. patent application Ser. No. 10/602,430, entitled "An Article Having Multiple Spectral Deposits" filed Jun. 24, 2003, in the name of Nelson et at.

FIELD OF THE INVENTION

This invention relates generally to light-emitting displays and, more specifically, it relates to organic light emitting color displays.

BACKGROUND OF THE INVENTION

Organic Light emitting display (OLED) devices can be classified as either organic small molecule type or polymeric type based on the nature of electroluminescent material used to create the device. In simplest form, an OLED device is comprised of an anode for hole injection, a cathode for electron injection, and an organic medium sandwiched between these electrodes to support charge recombination that yields emission of light. A simple OLED device can be constructed from an electroluminescent organic small molecule or polymeric layer sandwiched between an electron injection cathode and a hole injection anode. More complicated devices utilize electron and hole transport layers between the above mentioned electrode and the electroluminescent layers.

Common OLED devices include very simple structures comprising a single anode and cathode to more complex devices, such as passive and active matrix displays. A passive matrix display is comprised of orthogonal arrays of anodes and cathodes to form pixels at their intersections, wherein each pixel acts as an OLED device that can be electrically activated independently of other pixels. In active-matrix displays, an array of OLED devices (pixels) are formed in contact with thin film transistors (TFTs) such that each pixel is activated and controlled independently by these TFTs. Full color displays can be constructed using either active or passive matrix designs, as is well known in the art. See for example U.S. Pat. Nos. 5,684,365, 5,294,870, and U.S. Pat. No. 5,294,869.

In prior art multicolor fabrication systems, a masking operation is often first performed to protect the areas that are not to receive an electroluminescent material. The electroluminescent material is then deposited using one of several techniques such as vacuum deposition, and casting and spin coating. The vacuum deposition process generally involves the evaporation of electroluminescent material by heating or by ion bombardment followed by deposition on the substrate by condensation or by a chemical reaction. An inherent limitation of the vacuum deposition process is that the electroluminescent material has to be thermally stable or has to have a thermally stable precursor that can generate the desired material on the substrate by a chemical reaction. This limits the choice of electroluminescent materials that can be used to create display devices.

After deposition of the electroluminescent material, the mask is removed and the mask for the next material layer is placed and the material is deposited. Such techniques are well known in art as shadow masking techniques. Each masking operation increases the cost of fabricating display devices and decreases the device yield. Hence it is advantageous to use methods that do not involve masking.

In U.S. Pat. No. 5,972,419, Roitman et al. disclose an inkjet printing method for making a polymer based electroluminescent device. The electroluminescent polymer containing dopants to produce one of three red, green and blue pixel is dissolved in xylene to form ink. The ink is then dispensed through an inkjet print head at desired locations to make the device. A major limitation of this technology is that the non-aqueous liquids/solvents used to formulate the ink can be hazardous to health and the disposal of which can be prohibitively expensive.

To eliminate the need for potentially harmful solvents, it is possible to use environmental and health-benign supercritical or dense-phase fluids such as carbon dioxide as solvents. Technologies that use supercritical fluid solvents to create thin films are also known. For example, R. D. Smith in U.S. Pat. No. 4,734,227, discloses a method of depositing solid films or creating fine powders through the dissolution of a solid material into a supercritical fluid solution and then rapidly expanding the solution to create particles of the marking material in the form of fine powders or long thin fibers, which may be used to make films. There is a problem with this method in that the free-jet expansion of the supercritical fluid solution results in a non-collimated/defocused spray that cannot be used to create high-resolution patterns directly on a receiver. Further, defocusing leads to losses of the marking material.

Other technologies that deposit a material onto a receiver using gaseous propellants are known. For example, Peeters et al., in U.S. Pat. No. 6,116,718, discloses a print head for use in a marking apparatus in which a propellant gas is passed through a channel, the marking material is introduced controllably into the propellant stream to form a ballistic aerosol for propelling non-colloidal, solid or semi-solid particulate or a liquid, toward a receiver with sufficient kinetic energy to fuse the marking material to the receiver. There is a problem with this technology in that the marking material and propellant stream are two different entities and the propellant is used to impart kinetic energy to the marking material. When the marking material is added into the propellant stream in the channel, a non-colloidal ballistic aerosol is formed prior to exiting the print head. This non-colloidal ballistic aerosol, which is a combination of the marking material and the propellant, is not thermodynamically stable/metastable. As such, the marking material is prone to settling in the propellant stream which, in turn, can cause marking material agglomeration, leading to discharge device obstruction and poor control over marking material deposition.

Huck et al., in WO 02/45868 A2, disclose a method of creating a pattern on a surface of a wafer using compressed carbon dioxide. The method includes dissolving or suspending a material in a solvent phase containing compressed carbon dioxide, and depositing the solution or suspension onto the surface of the wafer, the evaporation of the solvent phase leaving a patterned deposit of the material. The wafer is prepatterned using lithography to provide the wafer with hydrophilic and hydrophobic areas. After deposition of the solution (or suspension) onto the wafer surface followed by the evaporation of the solvent phase, the material (a polymer) sticks to one of the hydrophobic and hydrophilic areas. The solution (or suspension) is deposited on the wafer surface either in the form of liquid drops or a feathered spray.

This method is disadvantaged because deposition using a feathered spray requires that the wafer surface be prepatterned prior to deposition. Hence, direct patterning of the wafer surface is not possible because of the diverging profile (feathered) of the spray. Additionally, a wafer surface that has not been prepatterned can not be patterned using this method. This method also requires time for drying so that the solvent phase of the liquid drops (or feathered spray) can evaporate. During the time associated with solvent phase evaporation, the solvent and the material can diffuse (for example, into the surface or along the surface) degrading the desired pattern.

As such, there is a need for a technology that permits delivery of electroluminescent material to a receiver that reduces the need for post-deposition drying of the receiver.

SUMMARY OF THE INVENTION

According to one feature of the invention, a method of producing a light emitting display includes providing a substrate; providing a first addressing electrode on the substrate; controllably depositing an organic material over the first addressing electrode in a first location by delivering a mixture of a compressed fluid solvent and the organic material toward the first addressing electrode, the mixture being contained under a first condition prior to delivery toward the first addressing electrode; controllably depositing the organic material over the first addressing electrode in a second location, the second location being distinct from the first location, by delivering the mixture of the compressed fluid solvent and the organic material toward the first addressing electrode, the mixture being contained under a second condition prior to delivery toward the first addressing electrode, the second condition being distinct from the first condition; and providing a second addressing electrode over the organic material in the first and the second location, wherein the organic material associated with the first condition and the second condition becomes free of the compressed fluid solvent prior to reaching the first addressing electrode.

According to another feature of the present invention, a method of producing a light emitting display includes providing a substrate; providing a first addressing electrode on the substrate; controllably depositing a first organic material over the first addressing electrode by delivering a mixture of a compressed fluid solvent and the first organic material toward the first addressing electrode in a first location, the mixture being contained under a first condition prior to delivery toward the first addressing electrode; controllably depositing a second organic material over the first addressing electrode by delivering a mixture of a compressed fluid solvent and the second organic material toward the first addressing electrode in a second location, the second location being distinct from the first location, the mixture being contained under a second condition prior to delivery toward the first addressing electrode; and providing a second addressing electrode over the first and second organic materials in the first and the second location, wherein the first and second organic materials become free of the compressed fluid solvent prior to reaching the first addressing electrode.

According to another feature of the present invention, an apparatus for making a light emitting display includes a source of a mixture of a compressed fluid solvent and an organic material and a discharge device positioned in fluid communication with the source of the mixture of the compressed fluid and the organic material. A condition controlling device positioned in fluid communication between the source and the discharge device.

According to another feature of the present invention, an apparatus for making a light emitting display includes a first source of a mixture of a compressed fluid solvent and an organic material with the first source being maintained under a first condition and a first discharge device in fluid communication with the first source of the mixture of the compressed fluid and the organic material. A second source of the mixture of the compressed fluid solvent and the organic material with the second source being maintained under a second condition. A first condition controlling device is positioned in fluid communication between the first source and the second source. A second discharge device is in fluid communication with the second source of the mixture of the compressed fluid and the organic material.

According to another feature of the present invention, an apparatus for making a light emitting display includes a source of a mixture of a compressed fluid solvent and an organic material. A first formulation reservoir is positioned in fluid communication with the source with the first formulation reservoir being maintained under a first condition. A first discharge device is positioned in fluid communication with the first formulation reservoir. A first condition controlling device is positioned in fluid communication between the source and the first formulation reservoir. A second formulation reservoir is positioned in fluid communication with the source with the second formulation reservoir being maintained under a second condition. A second discharge device is positioned in fluid communication with the second formulation reservoir. A second condition controlling device is positioned in fluid communication between the source and the second formulation reservoir.

According to another feature of the present invention, a method of producing a light emitting display includes providing a substrate; providing a first addressing electrode on the substrate; controllably depositing an organic nanomorphic material over the first addressing electrode; and providing a second addressing electrode over the organic nanomorphic material.

BRIEF DESCRIPTION OF THE DRAWINGS

In the detailed description of the preferred embodiments of the invention presented below, reference is made to the accompanying drawings, in which.

DETAILED DESCRIPTION OF THE INVENTION

The present description will be directed in particular to elements forming part of, or cooperating more directly with, apparatus in accordance with the present invention. It is to be understood that elements not specifically shown or described may take various forms well known to those skilled in the art. Additionally, materials identified as suitable for various facets of the invention, for example, functional materials, solvents, equipment, etc. are to be treated as exemplary, and are not intended to limit the scope of the invention in any manner.

General Device Architecture

The present invention can be employed in most LED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

Figure 1:
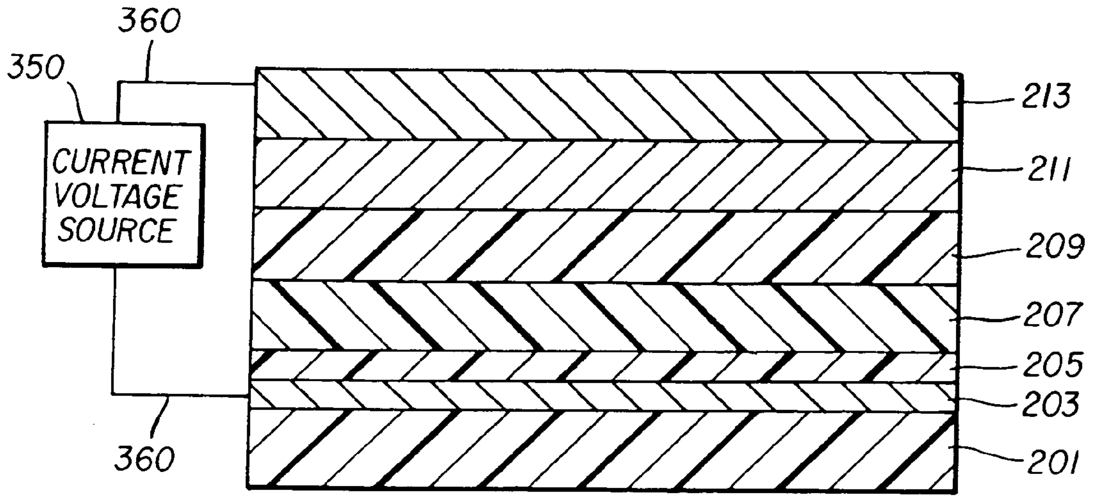
FIG. 1 is a cross-sectional view of an LED device.

There are numerous configurations of the layers wherein the present invention can be successfully practiced. A typical structure is shown in FIG. 1 and is comprised of a substrate 201, an anode 203, a hole-injecting layer 205, a hole-transporting layer 207, a light-emitting layer 209, an electron-transporting layer 211, and a cathode 213. These layers are described in detail below. Note that the substrate may alternatively be located adjacent to the cathode, or the substrate may actually constitute the anode or cathode. The electroluminescent layers between the anode and cathode are conveniently referred to as the organic EL element. The total combined thickness of the EL layers is preferably less than 500 nm.

The anode and cathode of the LED are connected to a voltage/current source 350 through electrical conductors 360. The LED is operated by applying a potential between the anode and cathode such that the anode is at a more positive potential than the cathode. Holes are injected into the organic EL element from the anode and electrons are injected into the organic EL element at the anode. Enhanced device stability can sometimes be achieved when the LED is operated in an AC mode where, for some time period in the cycle, the potential bias is reversed and no current flows. An example of an AC driven OLED is described in U.S. Pat. No. 5,552,678.

Substrate

The LED device of this invention is typically provided over a supporting substrate where either the cathode or anode can be in contact with the substrate. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Of course it is necessary to provide in these device configurations a light-transparent top electrode.

Anode

When EL emission is viewed through anode 203, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity.

Hole-Injecting Layer (HIL)

While not always necessary, it is often useful to provide a hole-injecting layer 205 between anode 203 and hole-transporting layer 207. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. Nos. 6,127,004, 6,208,075 and 6,208,077, and some aromatic amines, for example, m-MTDATA (4,4',4"-tris[(3-methylphenyl)phenylamino]triphenylamine). Alternative hole-injecting materials reportedly useful in organic EL devices are described in EP 0 891 121 A1 and EP 1 029 909 A1.

Hole-Transporting Layer (HTL)

The hole-transporting layer 207 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl (NPB)
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) 209 of the organic EL element includes a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine[alias, tris(8-quinolinolato)aluminum(III)]
CO-2: Magnesium bisoxine[alias, bis(8-quinolinolato) magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato) aluminum(III)
CO-5: Indium trisoxine[alias, tris(8-quinolinolato)indium]
CO-6: Aluminum tris(5-methyloxine)[alias, tris(5-methyl-8-quinolinolato) aluminum(III)]
CO-7: Lithium oxine[alias, (8-quinolinolato)lithium(I)]
CO-8: Gallium oxine[alias, tris(8-quinolinolato)gallium (III)]
CO-9: Zirconium oxine[alias, tetra(8-quinolinolato)zirconium(IV)]

Other classes of useful host materials include, but are not limited to: derivatives of anthracene, such as 9,10-di-(2-naphthyl)anthracene and derivatives thereof as described in U.S. Pat. No. 5,935,721, distyrylarylene derivatives as described in U.S. Pat. No. 5,121,029, and benzazole derivatives, for example, 2,2',2"-(1,3,5-phenylene)tris[1-phenyl-1H-benzimidazole]. Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis (azinyl)methane compounds, and carbostyryl compounds.

Electron-Transporting Layer (ETL)

Preferred thin film-forming materials for use in forming the electron-transporting layer 211 of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

Cathode

When light emission is viewed solely through the anode, the cathode 213 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with the organic layer (e.g., ETL) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of A1 as described in U.S. Pat. No. 5,677,572. Other useful cathode material sets include, but are not limited to, those disclosed in U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211, 5,247,190, JP 3,234,963, U.S. Pat. Nos. 5,703,436, 5,608,287, 5,837,391, 5,677,572, 5,776,622, 5,776,623, 5,714,838, 5,969,474, 5,739,545, 5,981,306, 6,137,223, 6,140,763, 6,172,459, EP 1 076 368, U.S. Pat. Nos. 6,278,236, and 6,284,393. Cathode materials are typically deposited by evaporation, sputtering, or chemical vapor deposition. When needed, patterning can be achieved through many well known methods including, but not limited to, through-mask deposition, integral shadow masking, for example, as described in U.S. Pat. No. 5,276,380 and EP 0 732 868, laser ablation, and selective chemical vapor deposition.

Other Common Layers and Device Architecture

In some instances, layers 209 and 211 can optionally be collapsed into a single layer that serves the function of supporting both light emission and electron transportation. It also known in the art that emitting dopants may be added to the hole-transporting layer, which may serve as a host. Multiple dopants may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, US 20020025419, EP 1 182 244, U.S. Pat. Nos. 5,683,823, 5,503,910, 5,405,709, and 5,283,182.

Additional layers such as electron or hole-blocking layers as taught in the art may be employed in devices of this invention. Hole-blocking layers are commonly used to improve efficiency of phosphorescent emitter devices, for example, as in US 20020015859.

These devices may be used in so-called stacked device architecture, for example, as taught in U.S. Pat. Nos. 5,703,436 and 6,337,492.

Apparatus for Color Tuning LED Devices

The delivery system 12, discussed herein, can be used to alter the reflected spectral peaks of an electroluminescent material(s) by varying conditions (for example, pressure and/or temperature) in one or more formulation reservoirs and/or during material ejection to create a multi-color display. FIGS. 2–9 describe example embodiments of delivery systems 12 that vary process parameters in order to create multi-color displays using one electroluminescent material.

Figure 2:
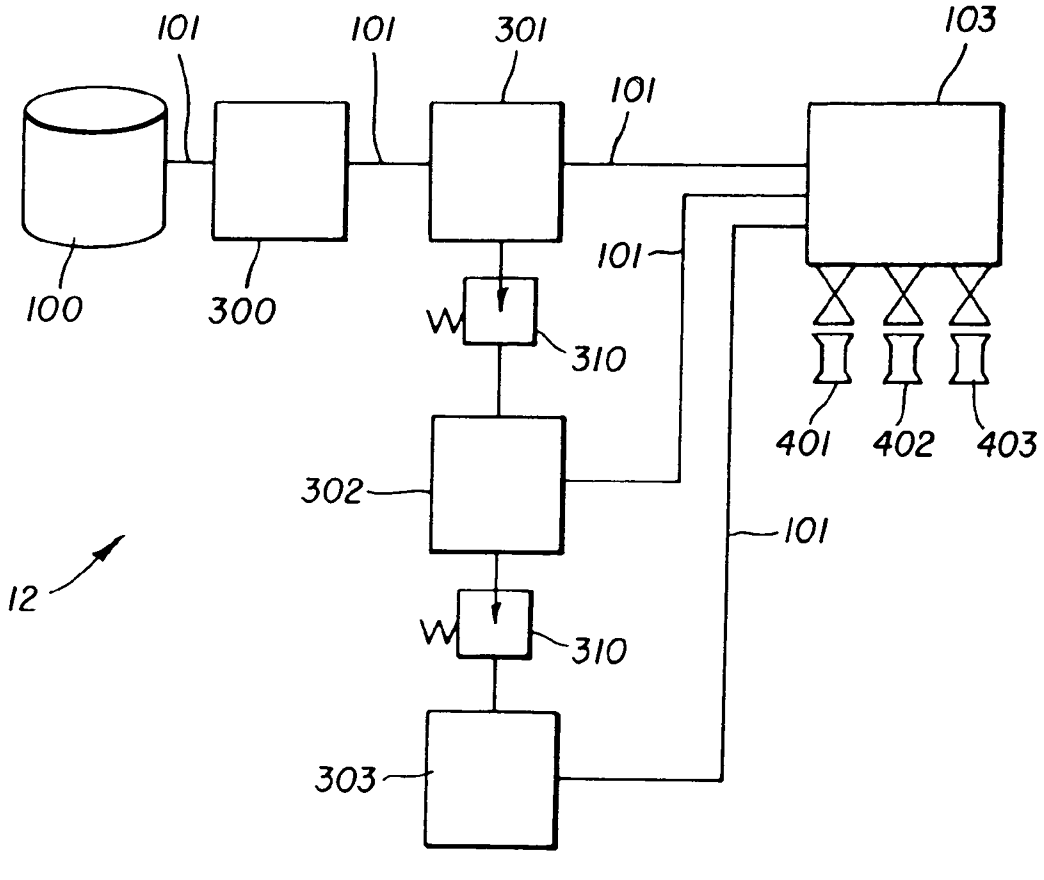
FIGS. 2–5 are schematic views of a functional material delivery system made in accordance with the present invention.

Referring to FIG. 2, a delivery system 12 is shown. Delivery system 12 includes a source of compressed fluid 100, a main formulation mixing tank 300, a highest pressure delivery tank 301, a medium pressure delivery tank 302, and a lowest pressure delivery tank 303. Fluid source 100 and tanks 300, 301, 302, 303 are connected in fluid communication through high pressure piping 101. Delivery system 12 enables the dissolution and/or dispersal of a selected electroluminescent material into a compressed fluid having a density greater than 0.1 g/cc$^3$.

Delivery system 12 supplies a printhead 103 with the solution and/or dispersion of the electroluminescent material under different conditions (for example, pressure and/or temperature), the ejection of which producing different colors from the same electroluminescent material. In the embodiment shown in FIG. 2, three tanks 301, 302, 303 are shown. Additional tanks or fewer tanks can be incorporated into the delivery system 12 as is necessary.

During deposition, the electroluminescent material ejected through nozzle 401 (for example, one or more nozzle connected to the highest pressure delivery tank 301) produces a first color electroluminescent material. The electroluminescent material ejected through nozzle 402 (for example, one or more nozzle connected to the medium pressure delivery tank 302) produces a second color electroluminescent material. The electroluminescent material ejected through nozzle 403 (for example, one or more nozzle connected to the lowest pressure delivery tank 303) produces a third color electroluminescent material. In order to reduce the pressure in the medium pressure tank 302 and the lower pressure tank 303, commonly available condition controlling devices 310 are used. In this configuration, delivery system 12 is self-regulating in that pressures in the individual tanks 301–303 can be maintained at optimum levels even though pressure variations typically occur as the material is being ejected.

One type of suitable condition controlling device 310 is commonly referred to as a pressure reduction valve, and is commercially available from, for example, Keidel Supply Co., Norwood, Ohio; Tyco valves and Controls, Houston, Tex.; etc. Additionally, although condition controlling with respect to pressure has been discussed with reference to a pressure reducing valve, there are other ways of controlling (for example, generating and/or reducing) pressure. For example, individual sources of compressed fluids could be supplied to the system at different pressures. Alternatively, condition controlling device 310 can be a temperature control device or any other suitable condition controlling mechanism. For example, a temperature controlling device can include heating mechanisms (heated coils, etc.) and/or cooling mechanisms (water jackets, etc.).

Although delivery system 12 is capable of providing distinct colors to create a multi-color display, as shown in FIG. 2 using constant pressure delivery tanks 301–303, condition controlling device 310 can be adjusted during operation to provide additional pressures for producing more colors. Pressure variation can also be used to increase color gamut in some applications.

Figure 3:
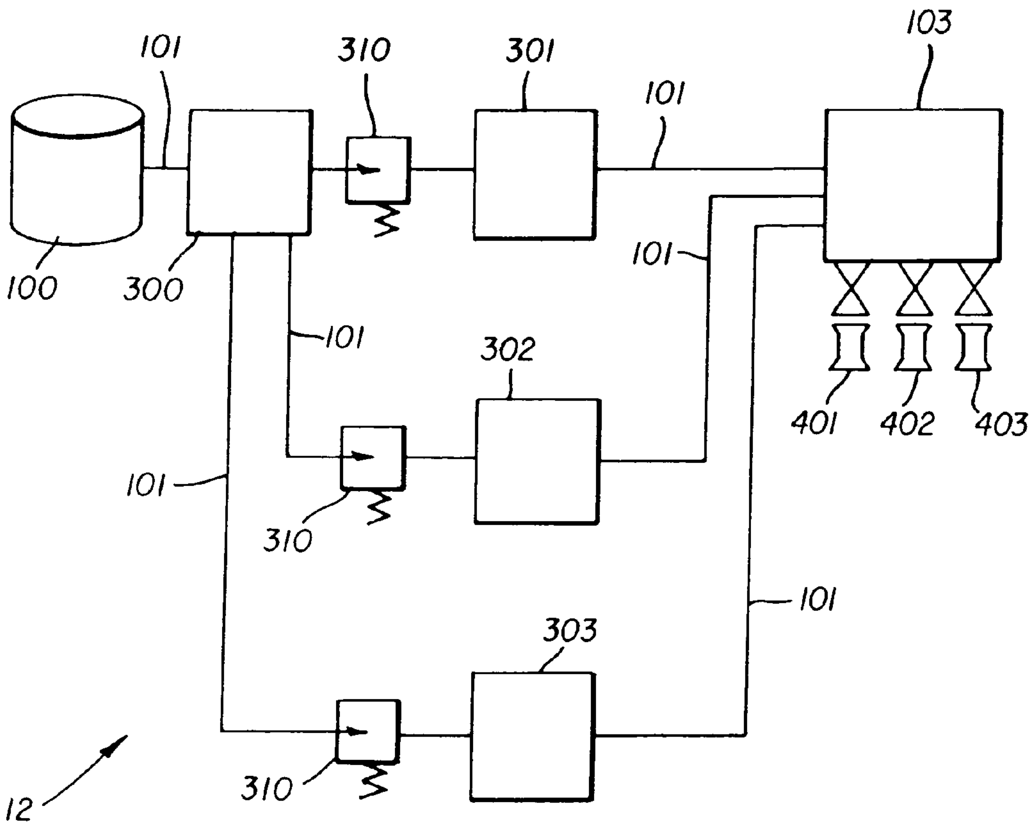

Referring to FIG. 3, an alternate embodiment of delivery system 12 is shown. Delivery system 12 includes a source of compressed fluid 100, a main formulation mixing tank 300, a highest pressure delivery tank 301, a medium pressure delivery tank 302, and a lowest pressure delivery tank 303. Fluid source 100 and tanks 300, 301, 302, 303 are connected in fluid communication through high pressure piping 101. Delivery system 12 enables the dissolution and/or dispersal of a selected electroluminescent material into a compressed fluid having a density greater than 0.1 g/cc$^3$.

Delivery system 12 supplies a printhead 103 with the solution and/or dispersion of the electroluminescent material under different conditions (for example, pressure and/or temperature), the ejection of which producing different colors from the same electroluminescent material. In this embodiment, each tank 301, 302, 303 is connected to formulation tank 300 through a condition controlling device 310 which allows for individual pressure control of each tank 301, 302, 303. In the embodiment shown in FIG. 3, three tanks 301, 302, 303 are shown. Additional tanks or fewer tanks can be incorporated into the delivery system 12 as is necessary. Material deposition is accomplished as described above with reference to FIG. 2.

Figure 4:
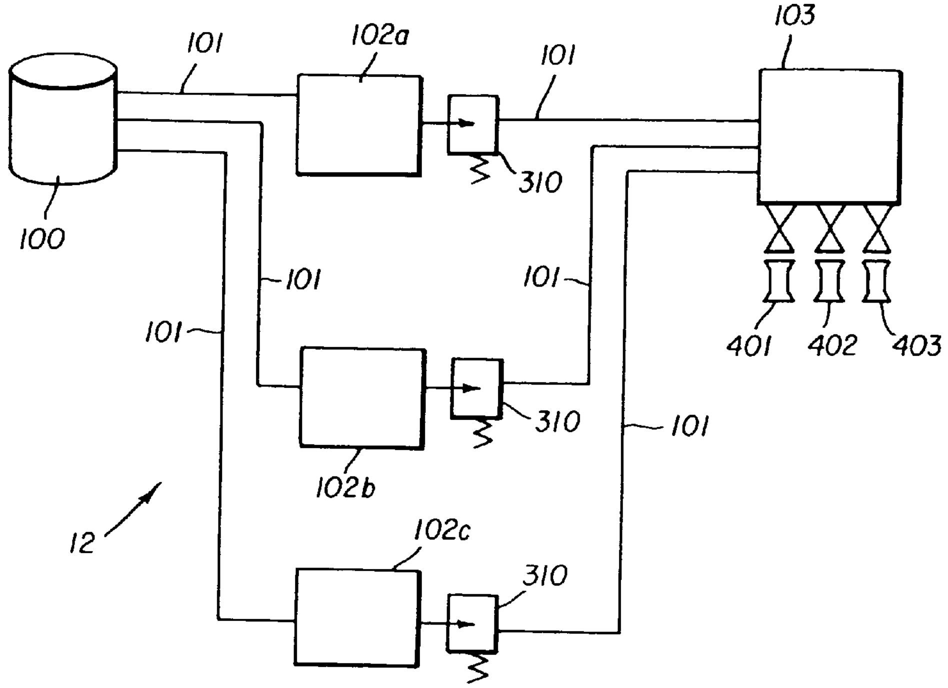

Referring to FIG. 4, an alternate embodiment of delivery system 12 is shown. In this embodiment, formulation and deposition conditions are controlled in order to achieve a improved color gamut. Delivery system 12 includes material reservoirs 102*a*, 102*b*, 102*c* with each reservoir being used to formulate a solution and/or dispersion using a distinct electroluminescent material. Compressed fluid is supplied to reservoirs 102*a*, 102*b*, 102*c* by a source of compressed fluid 100 through piping 101. Each reservoir 102*a*, 102*b*, 102*c* supplies a printhead 103 through a condition controlling device 310. As such, each electroluminescent material being supplied to printhead 103 can be independently controlled.

Prior to deposition, material reservoirs 102*a*, 102*b*, 102*c* are maintained at the highest desired pressure for each material, and are independently controlled (for example, pressure being reduced) during deposition using condition controlling device 310 to produce different spectral characteristics with each material. In this manner, an wider overall color gamut can be produced when a material is ejected through one of nozzles 401, 402, 403, by allowing one or more of the electroluminescent materials to be deposited over a range of operating conditions thereby producing different spectral reflection characteristics. When desired, more than three materials can be used to increase color gamut. This embodiment allows each material to vary over a range of spectral reflection characteristics which reduces the need for additional electroluminescent materials or additional dopants to create increased color gamut.

Figure 5:
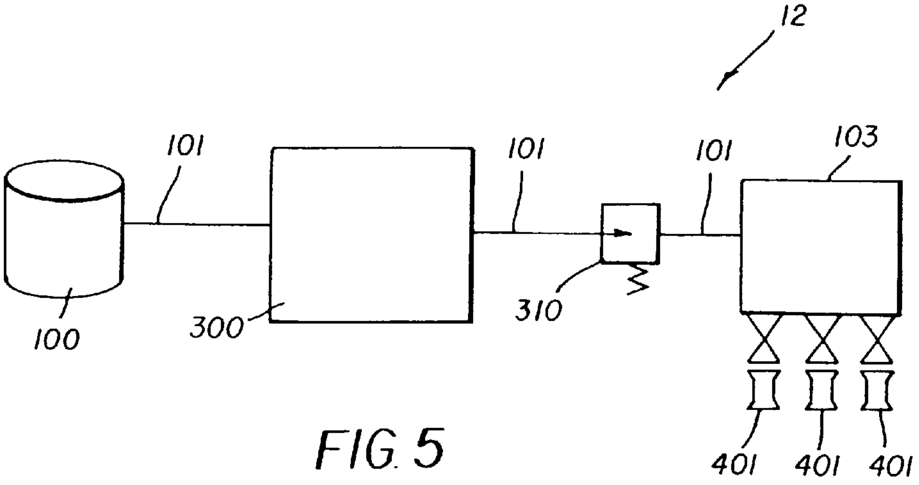

Referring to FIG. 5, another embodiment of a delivery system 12 is shown. In this embodiment, the main formulation tank 300 of the delivery system 12, as supplied by the source of compressed liquid 100, is used to supply printhead 103 with all of the material used during deposition. Typically, this embodiment is operated by depositing a first color and then depositing additional colors if desired.

The main formulation mixing tank 300 is pressurized to the maximum desired pressure for producing a first color by ejecting the material through printhead 103 over a substrate (not shown). If additional color(s)are desired, the condition controlling device 310 is set to another pressure (for example, the medium pressure, as discussed above) and the material is ejected using printhead 103. When a third color is desired, a third pressure is set using the condition controlling device 310, etc.

Figure 6:
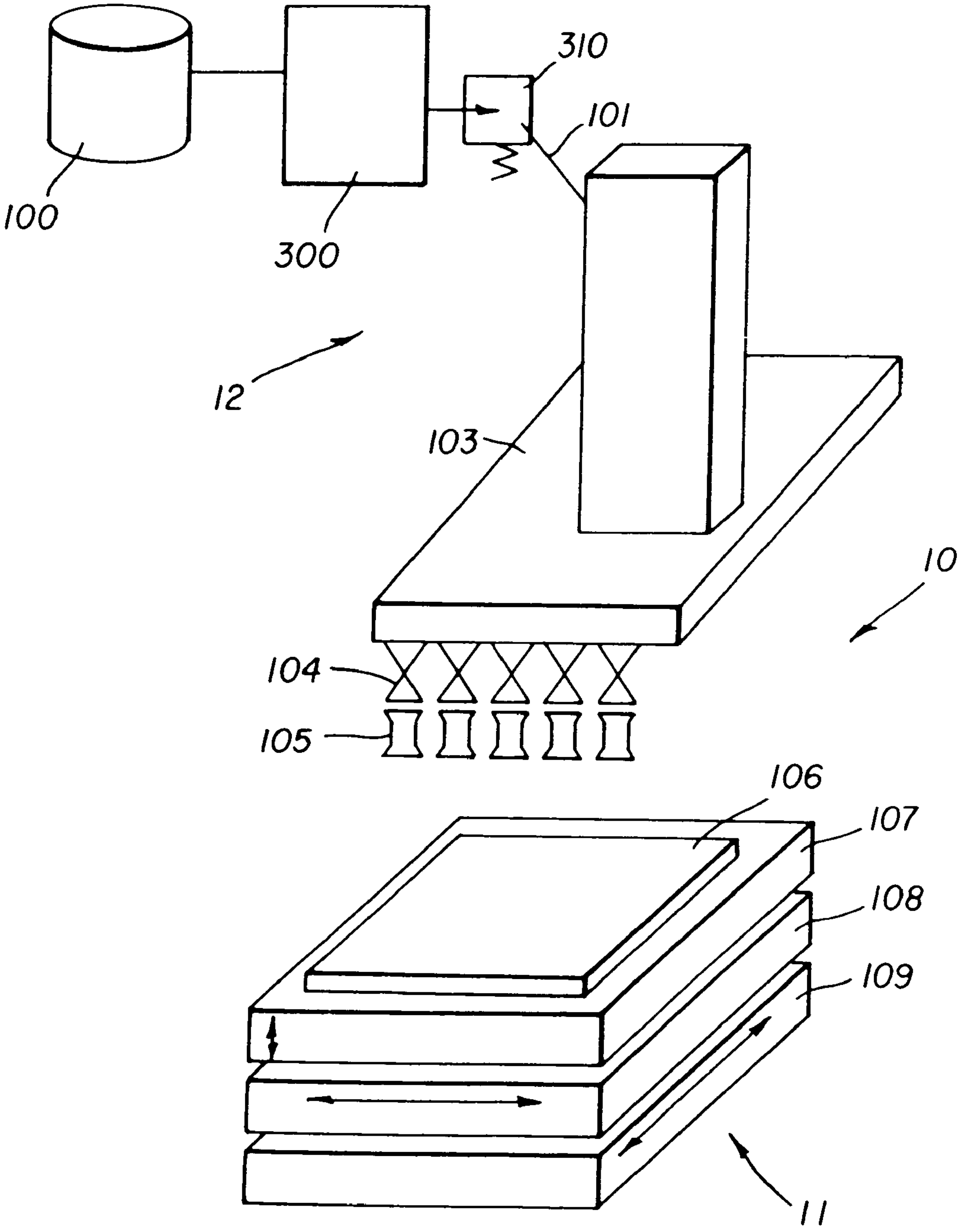
FIG. 6 is a schematic view of a printhead and substrate retaining device made in accordance with the present invention.
Figure 7A:
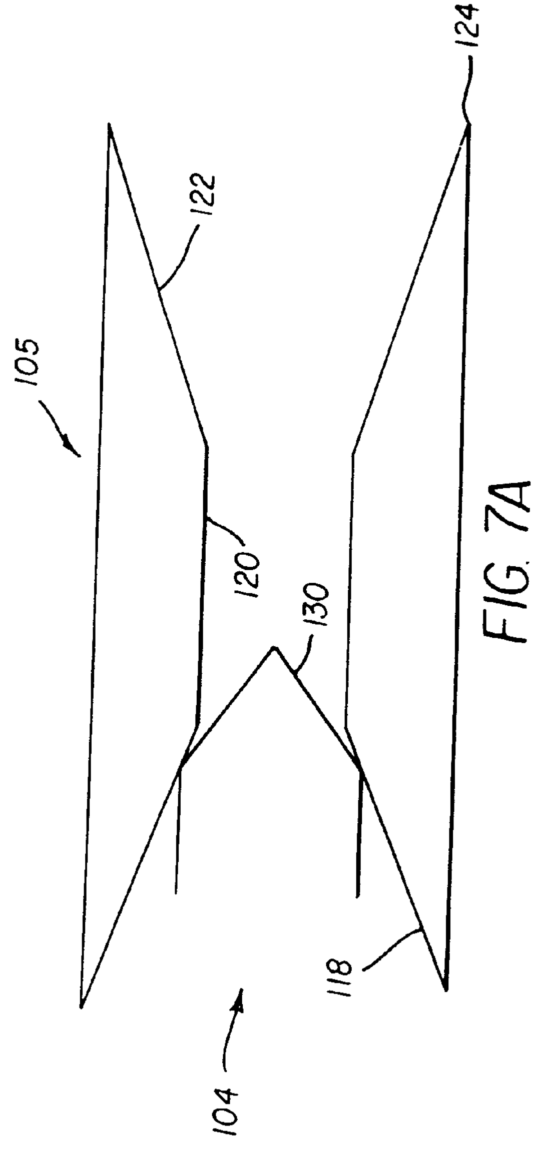
FIGS. 7A, 7B, 8A, and 8B are schematic views of a discharge device and an actuating mechanism made in accordance with the present invention.
Figure 7B:
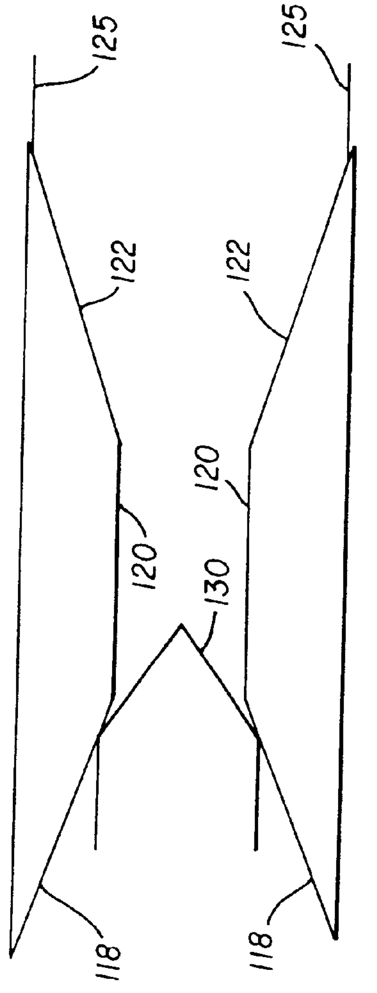
Figure 8A:
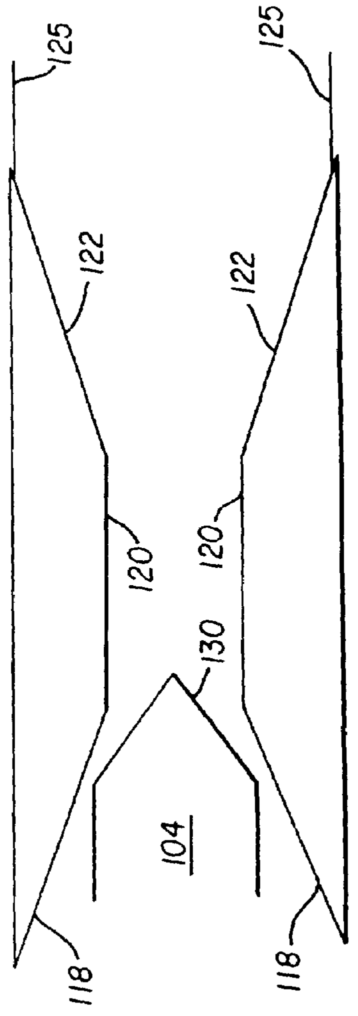
Figure 8B:
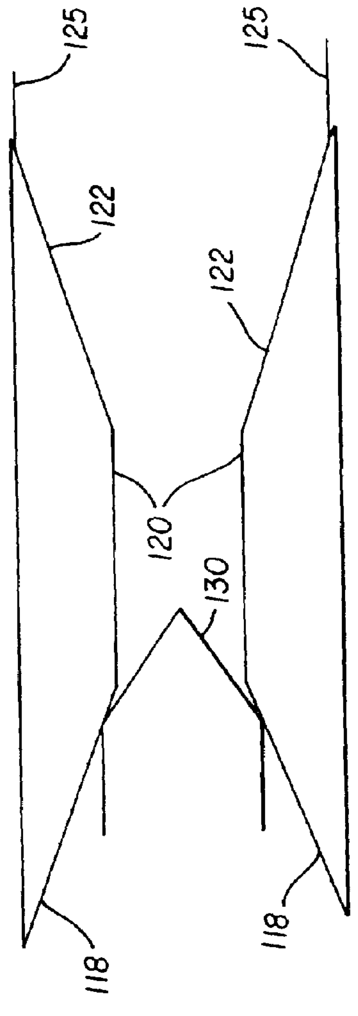

Referring to FIG. 6, one example of a delivery apparatus 10 is shown. Delivery apparatus 10 includes delivery system 12 connected to printhead 103. Printhead 103 is positioned over a substrate retaining device 11. In this embodiment, printhead 103 remains stationary during operation while substrate 106 is moved using one or more of the translation stages 107, 108, 109 of substrate retaining device 11. Alternately, the printhead 103 can be moved in one direction, while the substrate 106 is moved in another direction.

Other delivery apparatus 10 configurations and material delivery methods are possible. For example, the marking materials (with each marking material being maintained under a distinct condition) can be ejected through printhead 103 in succession or at the same time. (See, for example, U.S. patent application Ser. No. 10/016,054, filed on Dec. 6, 2001, in the name of Nelson et al.; and/or U.S. patent application Ser. No. 10/162,956, filed on Jun. 5, 2002, in the name of Sadasivan et al.). Marking material can also be delivered through delivery apparatus 10 in a continuous manner. (See, for example, U.S. patent application Ser. No. 10/287,579, filed on Nov. 4, 2002, in the name of Sadasivan et al.). Delivery apparatus 10 can also be calibrated and cleaned as is necessary. (See, for example, U.S. patent application Ser. No. 10/163,326, filed on Jun. 5, 2002, in the name of Sadasivan et al.). Additionally, precoats and/or overcoats can be applied either before or after delivering marking material to the substrate 106. (See, for example, U.S. patent application Ser. No. 10/051,888, filed on Jan. 17, 2002, in the name of Sadasivan et al.). The depth of marking material penetration into substrate 106 can also be controlled using delivery apparatus 10. (See, for example, U.S. Patent Application Publication U.S. 2003/0030706 A1, published Feb. 13, 2003, in the name of Jagannathan et al.).

Referring to FIGS. 7A–8B, the discharge device 105 of nozzle (s) 401, 402, 403 of print head 103 includes a first variable area section 118 followed by a first constant area section 120. A second variable area section 122 diverges from constant area section 120 to an end 124 of discharge device 105. The first variable area section 118 converges to the first constant area section 120. The first constant area section 118 has a diameter substantially equivalent to the exit diameter of the first variable area section 120. Alternatively, discharge device 105 can also include a second constant area section 125 positioned after the variable area section 122. Second constant area section 125 has a diameter substantially equivalent to the exit diameter of the variable area section 122. Discharge devices 105 of this type are commercially available from Moog, East Aurora, N.Y.; and Vindum Engineering Inc., San Ramon, Calif.

The actuating mechanism 104 is positioned within discharge device 105 and moveable between an open position 126 and a closed position 128 and has a sealing mechanism 130. In closed position 128, the sealing mechanism 130 in the actuating mechanism 104 contacts constant area section 120 preventing the discharge of the thermodynamically stable mixture of supercritical fluid and electroluminescent material. In open position 126, the thermodynamically stable mixture of supercritical fluid and electroluminescent material is permitted to exit discharge device 105.

The actuating mechanism 104 can also be positioned in various partially opened positions depending on the particular printing application, the amount of thermodynamically stable mixture of fluid and electroluminescent material desired, etc. Alternatively, actuating mechanism 104 can be a solenoid valve having an open and closed position. When actuating mechanism 104 is a solenoid valve, it is preferable to also include an additional position controllable actuating mechanism to control the mass flow rate of the thermodynamically stable mixture of fluid and electroluminescent material.

In a preferred embodiment of discharge device 105, the diameter of the first constant area section 120 of the discharge device 105 ranges from about 20 microns to about 2,000 microns. In a more preferred embodiment, the diameter of the first constant area section 120 of the discharge device 105 ranges from about 10 microns to about 20 microns. Additionally, first constant area section 120 has a predetermined length from about 0.1 to about 10 times the diameter of first constant area section 120 depending on the application. Sealing mechanism 130 can be conical in shape, disk shaped, etc.

Referring back to FIGS. 2–6, the delivery system 12 shown takes a predetermined electroluminescent material and a carrier fluid (for example, a solvent) to a compressed fluid state, makes a solution and/or dispersion of the predetermined material or combination of materials in the compressed fluid, and delivers the material(s) as a collimated and/or focused beam onto a substrate 106 in a controlled manner. (See, for example, U.S. Pat. No. 6,471,327 B2, issued to Jagannathan et al., on Oct. 29, 2002.).

In this context, the chosen solvents taken to a compressed fluid state are gases at ambient pressure and temperature. Ambient conditions are preferably defined as temperature in the range from −100 to +100° C., and pressure in the range from $1\times10^{-8}$–1000 atm for this application.

The fluid carrier, contained in the fluid source 100, is any material that dissolves/solubilizes/disperses a material. The fluid source 100 delivers the fluid carrier at predetermined conditions of pressure, temperature, and flow rate as a compressed fluid. Materials that are above their critical point, as defined by a critical temperature and a critical pressure, are known as supercritical fluids. The critical temperature and critical pressure typically define a thermodynamic state in which a fluid or a material becomes supercritical and exhibits gas like and liquid like properties. Materials that are at sufficiently high temperatures and pressures below their critical point are known as compressed liquids. Materials that are at sufficiently high critical pressures and temperatures below their critical point are known as compressed gases. Materials in their supercritical fluid and/or compressed liquid/compressed gas state that exist as gases at ambient conditions find application here because of their unique ability to solubilize and/or disperse materials of interest when in their compressed fluid state.

Fluid carriers include, but are not limited to, carbon dioxide, nitrous oxide, ammonia, xenon, ethane, ethylene, propane, propylene, butane, isobutane, chlorotrifluoromethane, monofluoromethane, sulphur hexafluoride and mixtures thereof. Carbon dioxide is generally preferred in many applications, due its characteristics, such as low cost, wide availability, etc.

The formulation reservoir 300 in FIGS. 2–6 is utilized to dissolve and/or disperse predetermined electroluminescent material in compressed liquid/compressed gas or supercritical fluids with or without dispersants and/or surfactants, at desired formulation conditions of temperature, pressure, volume, and concentration. The combination of electroluminescent material and compressed fluid is typically referred to as a mixture, formulation, etc.

The formulation reservoir 300 in FIGS. 2–6 can be made out of any suitable materials that can safely operate at the formulation conditions. An operating range from 0.001 atmosphere ($1.013\times10^{2}$ Pa) to 1000 atmospheres ($1.013\times10^{8}$ Pa) in pressure and from −25 degrees Centigrade to 1000 degrees Centigrade is generally preferred. Typically, the preferred materials include various grades of high pressure stainless steel. However, it is possible to use other materials if the specific deposition or etching application dictates less extreme conditions of temperature and/or pressure.

The formulation reservoir 300 in FIGS. 2–6 should be adequately controlled with respect to the operating conditions (pressure, temperature, and volume). The solubility/dispersibility of materials depends upon the conditions within the formulation reservoir 300. As such, small changes in the operating conditions within the formulation reservoir 300 can have undesired effects on material solubility/dispensability.

Additionally, any suitable surfactant and/or dispersant material that is capable of solubilizing/dispersing the materials in the compressed fluid for a specific application can be incorporated into the mixture of material and compressed fluid. Such materials include, but are not limited to, fluorinated polymers such as perfluoropolyether, siloxane compounds, etc.

The electroluminescent material can be controllably introduced into the formulation reservoir 300. The compressed fluid is also controllably introduced into the formulation reservoir 300. The contents of the formulation reservoir 300 are suitably mixed, using a mixing device to ensure intimate contact between the predetermined electroluminescent material and compressed fluid. As the mixing process proceeds, electroluminescent material are dissolved or dispersed within the compressed liquid/compressed gas/supercritical fluid. The process of dissolution/dispersion, including the amount of electroluminescent materials and the rate at which the mixing proceeds, depends upon the electroluminescent materials itself, the particle size and particle size distribution of the electroluminescent material (if the electroluminescent material is a solid), the compressed fluid used, the temperature, and the pressure within the formulation reservoir 300. When the mixing process is complete, the mixture or formulation of electroluminescent materials and compressed fluid is thermodynamically stable/metastable, in that the electroluminescent materials are dissolved or dispersed within the compressed fluid in such a fashion as to be indefinitely contained in the same state as long as the temperature and pressure within the formulation chamber are maintained constant. This state is distinguished from other physical mixtures in that there is no settling, precipitation, and/or agglomeration of electroluminescent material particles within the formulation chamber, unless the thermodynamic conditions of temperature and pressure within the reservoir are changed. As such, the electroluminescent material and compressed fluid mixtures or formulations of the present invention are said to be thermodynamically stable/metastable. This thermodynamically stable/metastable mixture or formulation is controllably released from the formulation reservoir 300 through the discharge device 105 and actuating mechanism 104.

During the deposition process, the materials are precipitated from the compressed fluid as the temperature and/or pressure conditions change. The precipitated materials are preferably directed towards a substrate 106 by the discharge device 105 through the actuating mechanism 104 as a focussed and/or collimated beam. The invention can also be practiced with a divergent beam provided that the diameter of first constant area section 120 and printhead 103 to receiver 106 distance are appropriately small. For example, in a discharge device 105 having a 10 um first constant area section 120 diameter, the beam can be allowed to diverge before impinging receiver 106 in order to produce a pixel size of required dimensions.

Discharge device 105 diameters of these sizes can be created with modern manufacturing techniques such as focused ion beam machining, MEMS processes, etc. Alternatively, capillary tubing made of PEEK, polyimide, etc. having a desired inner diameter (ca. 10 microns) and a desired outer diameter (ca. 15 microns) can be bundled together in order to form printhead 103 (for example, a rectangular array of capillaries in a 4×100, a 4×1000, or a 4×10000 matrix). Each capillary tube is connected to an actuating mechanism 104 thereby forming discharge device 105. Printing speed for a printhead formed in this fashion can be increased for a given actuating mechanism frequency by increasing the number of capillary tubes in each row.

The particle size of the electroluminescent materials deposited on the receiver 105 is typically in the range from 1 nanometer to 1000 nanometers. The particle size distribution may be controlled to be uniform by controlling the rate of change of temperature and/or pressure in the discharge device 105, the location of the receiver 106 relative to the discharge device 105, and the ambient conditions outside of the discharge device 105.

The print head 103 is also designed to appropriately change the temperature and pressure of the formulation to permit a controlled precipitation and/or aggregation of the materials. As the pressure is typically stepped down in stages, the formulation fluid flow is self-energized. Subsequent changes to the formulation conditions (a change in pressure, a change in temperature, etc.) result in the precipitation and/or aggregation of the material, coupled with an evaporation of the compressed fluid. The resulting precipitated and/or aggregated material deposits on the receiver 106 in a precise and accurate fashion. Evaporation of the supercritical fluid and/or compressed liquid/compressed gas can occur in a region located outside of the discharge device 105. Alternatively, evaporation of the compressed fluid can begin within the discharge device 105 and continue in the region located outside the discharge device 105. Alternatively, evaporation can occur within the discharge device 105.

A beam (stream, etc.) of the material and the compressed fluid is formed as the formulation moves through the discharge device 105. When the size of the precipitated and/or aggregated materials is substantially equal to an exit diameter of the discharge device 105, the precipitated and/or aggregated materials have been collimated by the discharge device 105. When the sizes of the precipitated and/or aggregated materials are less than the exit diameter of the discharge device 105, the precipitated and/or aggregated materials have been focused by the discharge device 105.

The substrate 106 is positioned along the path such that the precipitated and/or aggregated predetermined materials are deposited on the receiver 106. The distance of the receiver 106 from the discharge device 105 is chosen such that the compressed fluid evaporates to the gas phase prior to reaching the receiver 106. Hence, there is no need for a subsequent receiver drying processes. Alternatively, the receiver 106 can be electrically or electrostatically charged, such that the location of the material in the receiver 106 can be controlled.

It is also desirable to control the velocity with which individual particles of the marking material are ejected from the discharge device 105. As there is a sizable pressure drop from within the printhead 103 to the operating environment, the pressure differential converts the potential energy of the printhead 103 into kinetic energy that propels the material particles onto the receiver 106. The velocity of these particles can be controlled by suitable discharge device 105 with an actuating mechanism 104. Discharge device 105 design and location relative to the receiver 106 also determine the pattern of material deposition.

The temperature of the discharge device 105 can also be controlled. Discharge device temperature control may be controlled, as required, by specific applications to ensure that the opening in the discharge device 105 maintains the desired fluid flow characteristics.

The substrate 106 can be any solid material, including an-organic, an inorganic, a metallo-organic, a metallic, an alloy, a ceramic, a synthetic and/or natural polymeric, a gel, a glass, or a composite material. Additionally, the substrate 106 can have more than one layer. The substrate 106 can be a sheet of predetermined size.

Figure 9:
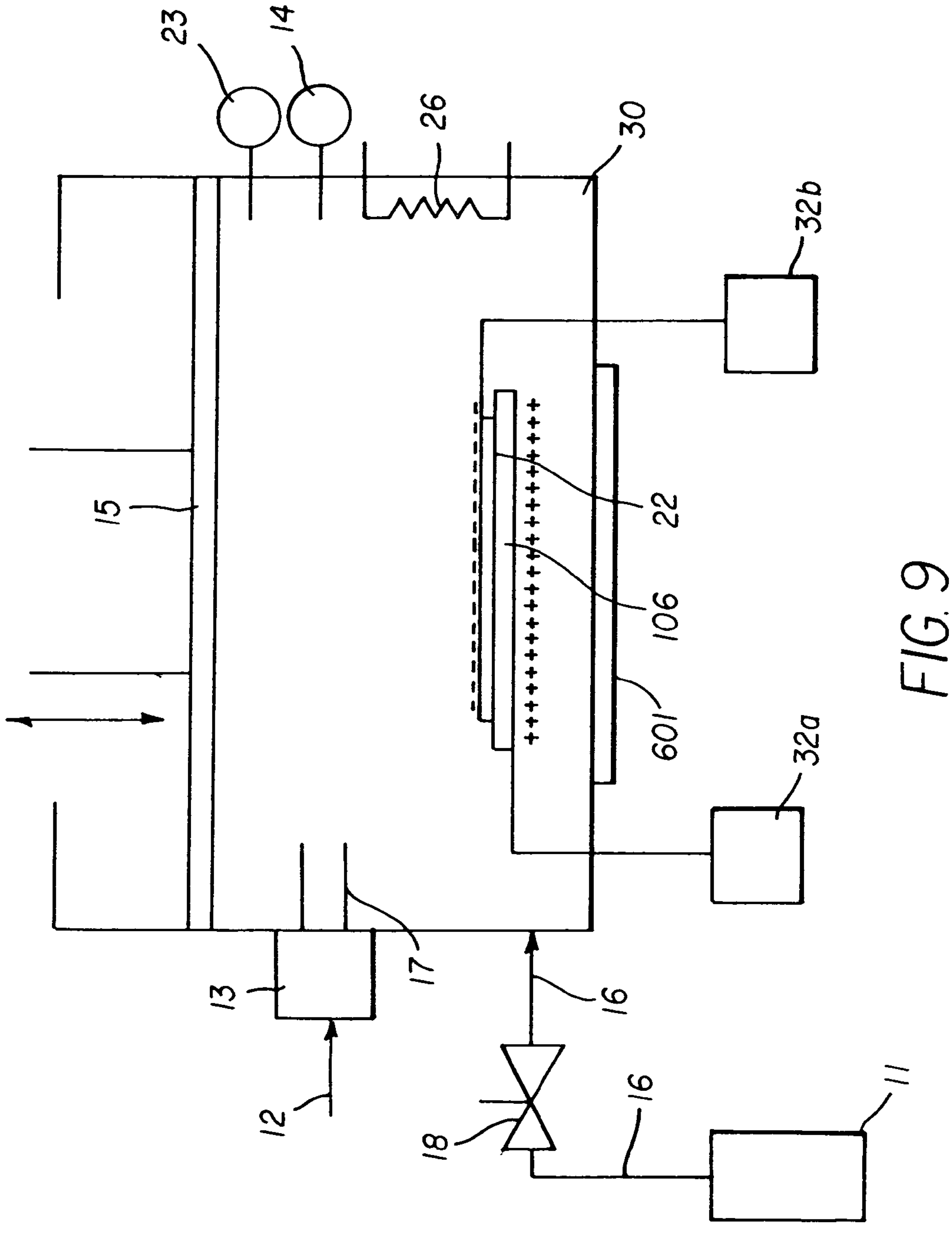
FIG. 9 is a schematic view of an enclosure embodiment made in accordance with the present invention.

Referring to FIG. 9, an alternate embodiment having a controlled environment 30, such as a deposition chamber, arranged proximate to delivery system 12 is shown. Controlled environment 30 is positioned at one end of the fluid delivery path 13 of delivery system 12. Substrate 106 to be patterned with deposition material is suitably arranged within deposition chamber 30. In close proximity to substrate 106, a mask 22 is preferably used to control the location of the deposited electroluminescent material on the substrate 106. Mask 22 may be physical (separate) or integral. The purpose of the mask 22 is to provide a pattern for the deposition of functional solute material. Those skilled in the art will appreciate that mask design and manufacture is well established. Physical masks require direct contact between mask 22 and substrate 106. Their advantage is that they are relatively inexpensive and can be re-used for multiple substrates 106. However, if the substrate 106 is delicate, the physical contact may damage the substrate 106. Precise alignment is also difficult. Integral masks 22 are structures formed on the substrate 106 prior to coating/deposition. Alignment and spacing is easier because the mask 22 is a part of the substrate 106. However, because of the potential need to remove the mask 22 after deposition, a subsequent etching step may be necessary, potentially making this more expensive and time-consuming.

Controlled environment 30 is designed for use at extremes of pressure. Incorporated in the controlled environment 30 is a pressure modulator 15. The pressure modulator 15, as shown, resembles a piston. This is for illustration only. Skilled artisans will also appreciate that pressure modulator 15 could also be a pump or a vent used in conjunction with an additional pressure source. An example of an additional pressure source is the source 11 of compressed fluid. This source 11 is modulated with a flow control device or valve 18 to enable functional material to enter the deposition chamber 30 via a fluid delivery path 16. The pressure inside the deposition chamber 30 is carefully monitored by a pressure sensor 23 and can be set at any pressure less than that of the delivery system 12 (including levels of vacuum) to facilitate precipitation/aggregation. In addition, the deposition chamber 30 is provided with temperature sensor 14 and temperature modulator 26. Temperature modulator 26 is shown as an electric heater but could consist of any of the following (not shown): heater, a water jacket, a refrigeration coil, and a combination of temperature control devices.

Deposition chamber 30 generally serves to hold the substrate 106 and the mask 22 and facilitates the deposition of the precipitated functional material. To enable a more complete and even distribution of the functional material, electric or electrostatic charges can be applied to the substrate 106 and/or mask 22. Through the ejection process in the discharge assembly, the particles are known to become charged. If desired, additional charge can be applied to them using a particle charging device 17. The electroluminescent material, now charged can be attracted or repelled from various surfaces to aid in the deposition process. Charging devices 32*a*, 32*b* are provided for both the substrate 106 and mask 22, respectively. For illustrative purposes only, a positive charge (+) is shown on substrate 106 and a negative charge (−) is shown on mask 22. The polarity may be changed to suit the application. A charge equal to that of the functional material is applied to the mask 22, whereas a charge opposite of that of the functional material is applied to the substrate 106 to attract the functional material. Obviously there can be no electrical conduction between the two to maintain the charge differential. This may limit the material selection of one or both, or add the requirement for an additional insulating layer (not shown). In a similar manner, it may be beneficial to create other electric or electrostatic charges on the deposition chamber 30 or on any other mechanical elements within the deposition chamber 30.

Referring again to FIG. 9, deposition chamber 30 also provides easy access for the insertion and removal of the substrate 106 through access port 601. This process will potentially be automated by mechanical devices which are not shown. Access port 601 of deposition chamber 30 also provides access for the insertion and removal of the mask 22 as well as for the proper placement of the mask 22. Mask alignment relative to the substrate 106 is key to this application and may be manual or preferably, automated. Though it is shown oriented with the substrate 106 facing upwards, this is not a requirement of the invention. When attracting particles electrostatically, it may be advantageous to orient the substrate 106 facing downward. In this manner, no debris from the deposition chamber 30 could inadvertently fall onto the substrate 106.

The controlled environment can be used for post deposition processing of the deposited electroluminescent material on the substrate. Post deposition processing may involve the control of humidity, temperature, atmospheric conditions including pressure, and chemical composition of the atmosphere. As an example, many processes require the curing of the materials to obtain desired functionality at elevated temperature. The thermal control that is already built into the enclosure can be utilized for this purpose. Alternatively, the post processing required can be done outside the enclosure.

It should be appreciated that deposition chamber 30 should also be designed so that there are no dead volumes that may result in the accumulation of precipitated functional materials and so that it may be easily cleaned. As such, it may be further partitioned into more than one subchamber to facilitate the above (not shown). It may also be equipped with suitable mechanical devices to aid the precipitation and deposition of functional material. An example of such a device would be a mechanical agitator.

Method of Color Tuning a LED Display

Methods of color tuning a light emitting display will now be discussed. A first method begins with providing a substrate. A first addressing electrode is provided on the substrate. An organic material is controllably deposited over the first addressing electrode by delivering a mixture of a compressed fluid solvent and the organic material toward the first addressing electrode to produce the first colored pixel. This first colored pixel when suitably addressed with a set of electrodes will produce the first color. To produce this first colored pixel, the mixture is contained under a first condition prior to delivery toward the first addressing electrode.

The organic material is then controllably deposited over the first addressing electrode by delivering the mixture of the compressed fluid solvent and the organic material toward the first addressing electrode to produce a second colored pixel, adjacent to the first colored pixel in a predetermined fashion. The mixture is contained under a second condition prior to delivery toward the first addressing electrode to produce a second colored pixel.

The second condition is distinct from the first condition. A second addressing electrode is provided over the first and second colored pixel of the organic material. In either case, the organic material associated with the first condition and the second condition becomes free of the compressed fluid solvent prior to reaching the first addressing electrode.

Altering the pressure and temperature in the formulation reservoir can create the first and the second condition. If the conditions calls for controlling the pressure, the first condition then means maintaining the mixture of the compressed fluid solvent and the organic material under a first pressure and the second condition then means maintaining the mixture of the compressed fluid solvent and the organic material under a second pressure. In such scenarios, controllably depositing the organic material of the mixture contained under the first condition includes delivering the mixture from the first pressure to a solvent evaporating pressure and controllably depositing the organic material of the mixture contained under the first condition includes delivering the mixture from the second pressure to a solvent evaporating pressure.

If the intent is to control the temperature, the first condition includes maintaining the mixture of the compressed fluid solvent and the organic material under a first temperature and the second condition includes maintaining the mixture of the compressed fluid solvent and the organic material under a second temperature. In such a scenario, controllably depositing the organic material of the mixture contained under the first condition includes delivering the mixture from the first temperature to a solvent evaporating temperature and controllably depositing the organic material of the mixture contained under the second condition includes delivering the mixture from the second temperature to a solvent evaporating temperature.

To create a third colored pixel, the organic material is controllably deposited over the first addressing electrode by delivering the mixture of the compressed fluid solvent and the organic material toward the first addressing electrode, adjacent to first and second colored pixel. The mixture is kept under a third condition prior to delivery toward the first addressing electrode and the third condition is distinct from the first condition and second condition.

In a preferred embodiment, the organic material of the mixture contained under the first condition is controllably deposited over the first addressing electrode, which includes positioning a mask over the first addressing electrode prior to the organic material reaching the first addressing electrode to create the first colored pixel. This also includes charging the organic material and oppositely charging the substrate to facilitate uniform deposition of the organic material over the first addressing electrode. To create a second colored pixel, the organic material of the mixture contained under the second condition is controllably deposited over the first addressing electrode, which includes positioning a second mask over the first addressing electrode prior to the organic material reaching the first addressing electrode. This also includes charging the organic material and oppositely charging the substrate.

In a yet another preferred embodiment, the organic material of the mixture contained under the first condition is controllably deposited over the first addressing electrode, which includes discretely delivering the organic material through a discharge device over a predetermined location of the first addressing electrode to create the first colored pixel. To create a second colored pixel, the organic material of the mixture contained under the second condition is controllably deposited over the first addressing electrode, which includes discretely delivering the organic material through a discharge device over a predetermined location of the first addressing electrode.

Finally, in all the embodiments described above, a second addressing electrode is provided over the organic material forming the first or second or third colored pixel, to form the device. A simple three layer device structure is described here, nonetheless, those skilled in the art will realize that additional layers such as hole transporting layer, electron transporting layer and such can be included in creating this device.

In yet another preferred embodiment, the device may include more than one organic material forming the first, second, third or multi colored pixel to create a multi-colored display. In such cases, a first organic material is controllably deposited over the first addressing electrode by delivering a mixture of a compressed fluid solvent and the first organic material toward the first addressing electrode. The mixture of the first organic material and the solvent is contained under a first condition prior to delivery toward the first addressing electrode. A second organic material is then controllably deposited concurrently over the first addressing electrode by delivering a mixture of a compressed fluid solvent and the second organic material toward the first addressing electrode. The mixture of the second organic material and the solvent is contained under a second condition prior to delivery toward the first addressing electrode. The first and second organic materials become free of the compressed fluid solvent prior to reaching the first addressing electrode. Finally, a second addressing electrode is provided over the first and second organic materials.

The mechanism behind creating multiple colors from single electroluminescent material will be discussed now. Interactions between atoms in condensed matter result in properties that are characteristic of bulk solids. Bulk solids are classified as large particles or crystallites that are multiple tens of nanometers or larger in size. Classic scientific fields of study including physics, chemistry, and materials science that are used to explain the physical, mechanical, optical, etc., properties of bulk solids require the use of quantum mechanics to explain observed phenomena such as chemical bonds, superconductivity, electron spin and magnetic properties of matter, radiant heat emission, or radioactive decay.

As the length scale in these bulk solids approach a very small size, <20 nm (nanometer, $10^{-9}$ meter), these materials exhibit changes in properties that diverge from those in the bulk state. Particles in this size range can be referred to as nanocrystals. These changes in properties are the result of a reduction in electron energy levels. For example, small nanocrystals of gallium nitride (GaN), referred to as quantum dots, have been shown to have a photoluminescence peak centered at 2.95 eV (electron volts), which is 0.5 eV below the bulk GaN bandgap (B. Daudin et al., *MRS Internet J. Nitride Semicond. Res.* 4S1, G9.2 (1999)). These quantum dots trap electrons in a point comprised of a tiny cluster of inorganic semiconductor material <30 nm in diameter. Many investigators believe that quantum dots will provide a variety of advances for electronics: increased efficiency, reduced power consumption, increased speed of operation and novel electronic characteristics (M. May, *Science Observer,* July–August (1996)). A challenge that exists is to develop general processes for creating these small nanocrystals at the required size scale.

Much of the nanocrystal work mentioned in the literature centers around inorganic/ionic materials (C. B. Murray et al., *IBM J. Res. & Dev.,* v45, No1., pp 47–56, January 2001). Though the number of classes of organic/molecular materials is significantly greater than inorganic compounds, the literature related to organic/molecular nanocrystals is limited to those organic compounds that form H— or J-aggregates. The number of monomer units associated with H— and J-aggregate nano crystals has been estimated to be ca. 4 monomer units per absorbing unit (A. Herz, *Photog. Sci. Eng.,* 18, 323–335 (1974)). Interactions among dye molecules can generate large spectral shifts and/or changes in spectral band shape and intensity in absorption spectra. These magnitude and the direction of these shifts are the determined by the internal structure (i.e., H— or J-aggregate structure) of the nanocrystal. It is known that nanocrystals of certain dyes can be generated by gradually increasing their concentration in solution, and the internal structure of the nanocrystal is identified by the gradual shift of the absorption spectra to shorter wavelength (in the case of H-aggregates) or a sudden shift to longer wavelengths (as in the case of J-aggregates) (E. Jelley, *Nature,* 138, 1009–1010 (1936)). These H— and J-aggregate nanocrystals exhibit unique properties that differ from the properties of the bulk solid and are used in silver halide based photographic products.

The spectral shifts and/or changes in organic/molecular nanocrystals that don't form H— or J-aggregate structure in the nanocrystal may be understood by considering the analogous phenomenon of polymorphism in bulk (large) organic/molecular crystals. Polymorphism is defined as multiple crystal structures of the same molecular entity (J. Bernstein and J. Henk, *Industrial Applications of X-ray Diffraction,* Chapter 25, F. H. Chung and D. K. Smith eds., Marcel Dekker Inc., N.Y., 531–532 (2000)); i.e., a bulk crystal of a specific organic/molecular material may exhibit multiple crystal structures with different physical & mechanical properties, such as solubility, color, absorption, emission, bulk modulus, etc. An example of a material that exhibits polymorphism is tris(8-hydroxyquinoline)aluminum. Three polymorphs identified as α, β and γ were reported to exist (M. Brinkman et al., *J. Am. Chem. Soc.,* 122, 5147–5157 (2000)) with α and β exhibiting yellowish-green fluorescence and γ exhibiting blue fluorescence when excited with ultraviolet light (M. Braun et al. *J. Chem. Phys.,* 114(21), 9625–9632 (2001)). Since the fundamental phenomenon that is common to the nanocrystals that exhibit the H— & J-aggregate structures and the bulk organic/molecular crystals of organic/molecular that exhibit polymorphism is the variations in their internal structure (the structural details of how the molecules in the aggregate/solid are arranged with respect to each other), which leads to the observed changes in their physical and mechanical properties, the H- and J-aggregate structures observed organic/molecular nanocrystals may be regarded as a nanocrystalline manifestation of the polymorphism observed in bulk crystals. We refer to this manifestation as nanomorphism and the nanocrystals that exhibit nanomorphism are called nanomorphs. It is important to note that the type and number of nanomorphs that are possible for a specific organic/molecular material will be determined by the physical size of (ca. <50 nm in the shortest dimension) and the number of molecules (ca. <100) in the nanocrystal and hence need not be the same as the type and number of polymorphs of the same organic/molecular material in bulk crystal.

Another important point to note is that the type and number of polymorphs of a material that can be generated depends on the details of the method (process) by which the organic/molecular crystal is generated. For example, in the case of precipitation from liquid solvents, commonly used as the process for generating bulk crystals of organic/molecular materials, factors such as temperature, mixing, type of solvent, etc. are known to effect the type and number of polymorphs generated, for a given organic/molecular material (M. Bavin, *Chem. Ind.,* 527–529 (1989)). Precipitation from liquid solvents is regarded as a general process for generating bulk crystals of organic/molecular materials. An analogous, general process for generating nanocrystals of organic/molecular materials is precipitation from compressed fluids such as $CO_2$ by a RESS process. (See, for example, U.S. patent application Publication US 2003/0030706 A1, published Feb. 13, 2003, in the name of Jagannathan et al.). These nanoscale particles exhibit multiple molecular packing structures that are the result of rapid depressurization leading to rapid desaturation of compressed fluid that contains an organic, organometallic, or molecular material. A fundamental difference between precipitation from liquids and precipitation from compressed fluids such as $CO_2$ by the RESS process is the significantly faster rates of supersaturation generation and dissipation (D. Matson et al., *Ind. Eng. Chem. Res.,* 26, 2298–2306 (1987)). Hence, precipitation from compressed fluids such as $CO_2$ is a convenient process for generating nanomorphs.

Nanomorphs can be individual particles or a cluster of particles. The preferred size of nanomorph particles is less than 50 nanometers, more preferred less than 30 nanometers, and most preferred less than 20 nanometers. The molecular weight of a nanomorph has a lower limit of 10 and a preferred upper limit of 10,000, a more preferred upper limit of 20,000, and a most preferred upper limit of 100,000. Nanomorph materials are by definition a result of the novel precipitation methods described in this invention, and do not require any further processing steps, such as milling or grinding, to be of acceptable size for end use. In one embodiment of the invention, the light emitting display made in accordance with the present invention uses nanomorphs to obtain different colors from a single electroluminescent material. The light emitting display thus comprises, a first addressing electrode, a second addressing electrode and a nanomorphic material layer positioned between the first addressing electrode and the second addressing electrode. The nanomorphic material is a first organic nanomorphic material adapted to luminesce at a first wavelength, when addressed through the first and second addressing electrodes. Furthermore, a second organic nanomorphic material is also positioned between the first addressing electrode and the second addressing electrode in a location other than a location of the first organic nanomorphic material. The second organic nanomorphic material being adapted to luminesce at a second wavelength, upon addressing with the first and second addressing electrodes. In one embodiment of the invention, the first organic nanomorphic material has an equivalent chemical composition when compared to the second organic nanomorphic material. In another embodiment of the invention, the first organic nanomorphic material has a first chemical composition and the second organic nanomorphic material has a second chemical composition. The first chemical composition does not equal the second chemical composition.

The method of producing a light emitting display with nanomorphs will now be discussed. The method of producing the light emitting display begins with providing a substrate and a first addressing electrode on the substrate. Then an organic nanomorphic material is controllably deposited over the first addressing electrode. Finally, a second addressing electrode is provided over the organic nanomorphic material.

The organic nanomorphic material is a first organic nanomorphic material and is controllably deposited over the first addressing electrode by delivering a mixture of a compressed fluid solvent and an organic material toward the first addressing electrode. This mixture is contained under a first condition prior to delivery toward the first addressing electrode and the organic material associated with the first condition becomes free of the compressed fluid solvent prior to reaching the first addressing electrode. The organic nanomorphic material also includes a second organic nanomorphic material, the second nanomorphic material is controllably deposited over the first addressing electrode by delivering a mixture of a compressed fluid solvent and an organic material toward the first addressing electrode prior to providing the second addressing electrode in a location distinct from a location of the first organic nanomorphic material. . This mixture is contained under a second condition prior to delivery toward the first addressing electrode and the organic material associated with the second condition becomes free of the compressed fluid solvent prior to reaching the first addressing electrode.

EXAMPLES

Glass sheets, vacuum deposited with 85 nm layer of Indium Tin Oxide (ITO) and a superimposing 150 nm thick layer of 4,4'-Bis[N-1-naphthyl)-N-phenylamino[biphenyl (NPB) were used as substrates (called Substrate A hereafter). The high-pressure vessel used in the experiments was connected to an expansion chamber with stainless steel tubing. The tubing had a needle valve to control the flow of materials. The tip of the tubing had a 170-micrometer orifice through which the content of high-pressure vessel was released as described in the examples.

Example 1

A 280 ml high-pressure cell was loaded with 0.5 mg of C545T and 25 mg of $AlQ_3$ and 405 g of $CO_2$. The cell was then heated to 60 degree C. at 175 bar. The mixture was then stirred vigorously to dissolve all of the solid material in $CO_2$. After the material was completely dissolved in compressed $CO_2$, the stirrer was turned off. The system was allowed to stabilize for 5 minutes.

Inside the expansion chamber, Substrate A was placed on a ceramic plate kept at distance of 4.25" from the 170-micrometer orifice. A 2"×2" aluminum mask with a 1" circular hole at its center was then placed over substrate A such that the mask was prevented from sliding during the coating process. A plastic sheet was used as a shutter to cover the masked Substrate A. The expansion chamber was kept at ambient temperature and pressure but was purged with constant flow of nitrogen. The needle valve was then opened and the flow was allowed to become steady which took about 30 seconds. The plastic shutter was then removed to expose Substrate A and coat it with the spray issuing from the orifice for 10 minutes. The needle valve was then closed and the system was allowed to stabilize for 1 minute. Substrate A, thus modified, was called Substrate B. Substrate B was then removed and placed inside a desiccator for moisture protection.

Example 2

The procedure in Example 1 was repeated except that the high-pressure cell maintained at 250 bar and the coating of Substrate A was carried out for 5 minutes and 50 seconds. Substrate A, thus modified, was called Substrate C.

Figure 10:
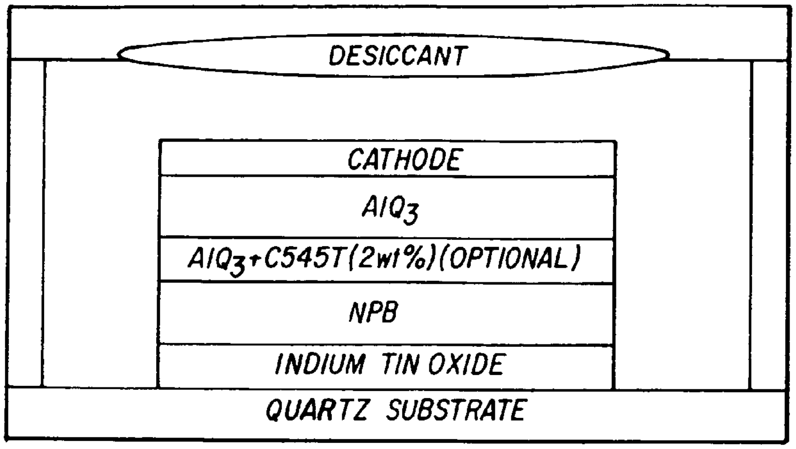
FIG. 10 is a schematic view of a LED device made in accordance with the present invention.

Substrate A, Substrate B, and Substrate C, each were then further vacuum coated with 35 nm layer of $AlQ_3$ and a cathode layer of 0.5 nm LiF and 100 nm Aluminum, as separate device structures (See FIG. 10 for schematic representation). The resultant structures were then packaged with desiccants to protect from moisture to form Device AD, Device BD, and Device CD, respectively. These devices were then tested by standard spectral radiometry for electrical luminescence.

Figure 11:
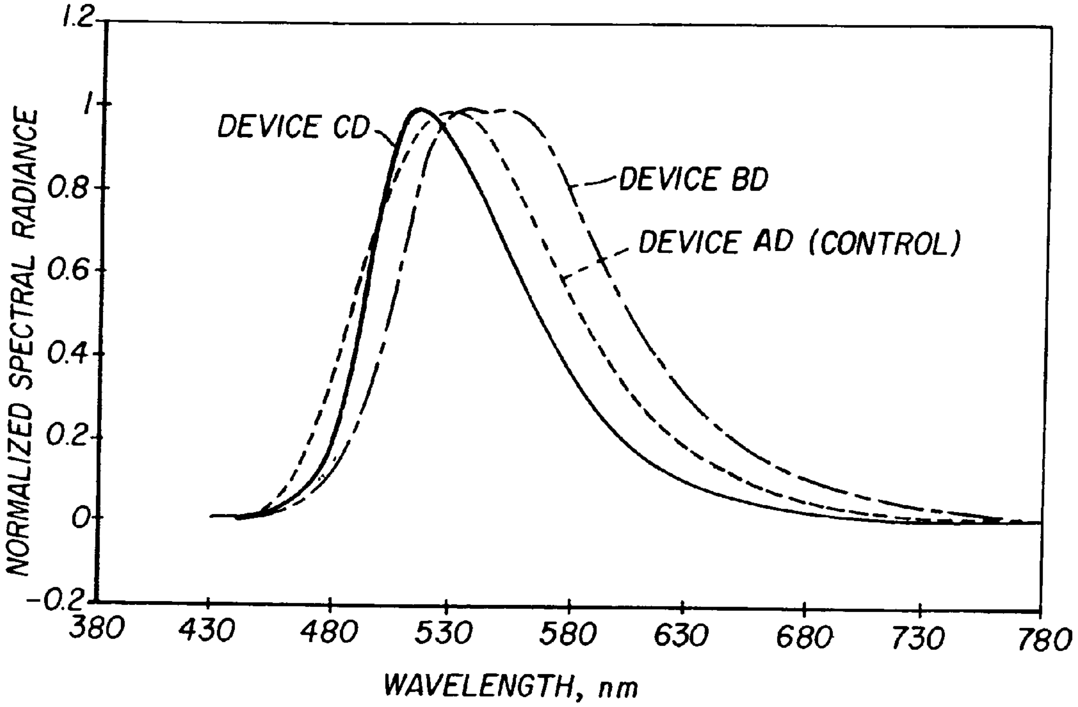
FIG. 11 is spectral response graph of an LED device made in accordance with the present invention.

The results are shown in FIG. 11 and key characteristics are summarized in the table below:

| Device | Pressure, bar | T, ° C. | Peak Wavelength, nm | Electro-luminescence Color |
|---|---|---|---|---|
| AD (Control) | — | — | 524 | Pale Green |
| BD | 175 | 60 | 545 | Yellow |
| CD | 250 | 60 | 516 | Green |

The results indicate the ability to tune the color of the device by adjusting the process parameters (i.e. pressure). While only two colors are shown here for demonstration, those skilled in the art will realize that the entire gamut of colors can be created by adjusting the process conditions.

Although the nanomorphic organic material described above can be manufactured and deposited using the apparatus and method described above, other apparatus and methods can be used. For example, the organic material can be manufactured using the process described above, collected, and then deposited using conventional technologies. Conventional technologies include, but are not limited to, incorporating the organic material in an inkjet ink and depositing the organic material using an inkjet printer; incorporating the organic material in a toner and depositing using an electrophotographic printer; incorporating the organic material on a donor sheet and depositing the organic material using a thermal printer; etc. Conventional technologies also include any technology that can be adapted to deposit the nanomorphic organic material without altering the characteristics (for example, the particle size(s)) of the nanomorphic organic material. These processes exclude those processes that lead to dissolution and re-precipitation of the organic material.

The invention has been described in detail with particular reference to certain preferred embodiments thereof, but it will be understood that variations and modifications can be effected within the scope of the invention.

What is claimed is:

1. A method of producing a light emitting display comprising:

providing a substrate;

providing a first addressing electrode on the substrate;

controllably depositing an electroluminescent organic material that exhibits polymorphism over a first location of the first addressing electrode by delivering a mixture of a compressed fluid solvent and the electroluminescent organic material toward the first location of the first addressing electrode;

containing the mixture under a first temperature and/or pressure condition prior to delivery toward the first location of the first addressing electrode by maintaining the mixture under a first temperature and/or pressure process parameter prior to delivery toward the first location of the first addressing electrode;

controllably depositing the same electroluminescent organic material over a second location of the first addressing electrode by delivering the mixture of the compressed fluid solvent and the electroluminescent organic material toward the second location of the first addressing electrode, the second location of the first addressing electrode being distinct from the first location of the first addressing electrode;

containing the mixture under a second temperature and/or pressure condition prior to delivery toward the second location of the first addressing electrode by maintaining the mixture under a second temperature and/or pressure process parameter prior to delivery toward the second location of the first addressing electrode, the second temperature and/or pressure condition being distinct from the first temperature and/or pressure condition; and providing a second addressing electrode over the electroluminescent organic material in the first and the second location, the electroluminescent organic material associated with the first temperature and/or pressure condition and the second temperature and/or pressure condition becoming free of the compressed fluid solvent prior to reaching the first addressing electrode, the deposited electroluminescent organic material associated with the first temperature and/or pressure condition having a first reflected spectral peak due to the first temperature and/or pressure process parameter, and the deposited electroluminescent organic material associated with the second temperature and/or pressure condition having a second reflected spectral peak due to the second temperature and/or pressure process parameter, the first reflected spectral peak being distinct relative to the second reflected spectral peak.

2. The method according to claim 1, wherein the first temperature and/or pressure condition includes maintaining the mixture of the compressed fluid solvent and the electroluminescent organic material under a first pressure to provide the first spectral peak and the second temperature and/or pressure condition includes maintaining the mixture of the compressed fluid solvent and the electroluminescent organic material under a second pressure to provide the second spectral peak.

3. The method according to claim 2, wherein controllably depositing the electroluminescent organic material of the mixture contained under the first temperature and/or pressure condition includes delivering the mixture from the first pressure to a solvent evaporating pressure.

4. The method according to claim 2, wherein controllably depositing the electroluminescent organic material of the mixture contained under the second temperature and/or pressure condition includes delivering the mixture from the second pressure to a solvent evaporating pressure.

5. The method according to claim 1, wherein the first temperature and/or pressure condition includes maintaining the mixture of the compressed fluid solvent and the electroluminescent organic material under a first temperature to provide the first spectral peak and the second temperature and/or pressure condition includes maintaining the mixture of the compressed fluid solvent and the electroluminescent organic material under a second temperature to provide the second spectral peak.

6. The method according to claim 5, wherein controllably depositing the electroluminescent organic material of the mixture contained under the first temperature and/or pressure condition includes delivering the mixture from the first temperature to a solvent evaporating temperature.

7. The method according to claim 5, wherein controllably depositing the electroluminescent organic material of the mixture contained under the second temperature and/or pressure condition includes delivering the mixture from the second temperature to a solvent evaporating temperature.

8. The method according to claim 1, further comprising:

controllably depositing the electroluminescent organic material over the first addressing electrode in a third location by delivering the mixture of the compressed fluid solvent and the electroluminescent organic material toward the first addressing electrode, the mixture being contained under a third temperature and/or pressure condition prior to delivery toward the first addressing electrode by maintaining the mixture under a third temperature and/or pressure process parameter prior to delivery toward the first addressing electrode, the third electroluminescent condition being distinct from the first temperature and/or pressure condition and second temperature and/or pressure condition, and the third location being distinct from the first and the second location, the deposited electroluminescent organic material associated with the third temperature and/or pressure condition having a third reflected spectral peak due to the third temperature and/or pressure process parameter, the third reflected spectral peak being distinct relative to the first and the second reflected spectral peak.

9. The method according to claim 1, wherein controllably depositing the electroluminescent organic material of the mixture contained under the first temperature and/or pressure condition over the first addressing electrode includes positioning a mask over the first addressing electrode prior to the electroluminescent organic material reaching the first addressing electrode.

10. The method according to claim 9, wherein controllably depositing the electroluminescent organic material over the first addressing electrode includes charging the organic material and oppositely charging the substrate.

11. The method according to claim 1, wherein controllably depositing the electroluminescent organic material of the mixture contained under the second temperature and/or pressure condition over the first addressing electrode includes positioning a second mask over the first addressing electrode prior to the electroluminescent organic material reaching the first addressing electrode.

12. The method according to claim 11, wherein controllably depositing the electroluminescent organic material over the first addressing electrode includes charging the electroluminescent organic material and oppositely charging the substrate.

13. The method according to claim 1, wherein controllably depositing the electroluminescent organic material of the mixture contained under the first temperature and/or pressure condition over the first addressing electrode includes discretely delivering the organic material through a discharge device over a predetermined location of the first addressing electrode.

14. The method according to claim 1, wherein controllably depositing the electroluminescent organic material of the mixture contained under the second temperature and/or pressure condition over the first addressing electrode includes discretely delivering the electroluminescent organic material through a discharge device over a predetermined location of the first addressing electrode.

15. The method according to claim 1, wherein the deposited electroluminescent organic material associated with the first temperature and/or pressure condition is nanomorphic.

16. The method according to claim 1, wherein the deposited electroluminescent organic material associated with the second temperature and/or pressure condition is nanomorphic.

17. A method of producing a light emitting display comprising:

providing a substrate;

providing a first addressing electrode on the substrate;

controllably depositing a first electroluminescent organic material that exhibits polymorphism over a first location of the first addressing electrode by delivering a mixture of a compressed fluid solvent and the first electroluminescent organic material toward the first location of the first addressing electrode;

containing the mixture of the compressed fluid solvent and the first electroluminescent organic material under a first temperature and/or pressure condition prior to delivery toward the first location of the first addressing electrode by maintaining the mixture under a first temperature and/or pressure process parameter prior to delivery toward the first location of the first addressing electrode;

controllably depositing a second electroluminescent organic material that exhibits polymorphism over a second location of the first addressing electrode by delivering a mixture of a compressed fluid solvent and the second electroluminescent organic material toward the second location of the first addressing electrode, the second location of the first addressing electrode being distinct from the first location of the first addressing electrode;

containing the mixture of the compressed fluid solvent and the second electroluminescent organic material under a second temperature and/or pressure condition prior to delivery toward the second location of the first addressing electrode by maintaining the mixture under a second temperature and/or pressure process parameter prior to delivery toward the second location of the first addressing electrode;

varying at least one of the first and second temperature and/or pressure conditions thereby causing at least one of the deposited first and second electroluminescent organic materials to exhibit a plurality of distinct reflected spectral peaks; and providing a second addressing electrode over the first and second electroluminescent organic materials in the first and the second location, wherein the first and second electroluminescent organic materials become free of the compressed fluid solvent prior to reaching the first addressing electrode.

18. The method according to claim 17, wherein the second temperature and/or pressure condition is distinct when compared to the first temperature and/or pressure condition.

19. The method according to claim 17, wherein controllably depositing the first electroluminescent organic material includes varying the first temperature and/or pressure condition.

20. The method according to claim 17, wherein controllably depositing the second electroluminescent organic material includes varying the second temperature and/or pressure condition.

21. The method according to claim 17, wherein the first temperature and/or pressure condition includes maintaining the mixture of the compressed fluid solvent and the electroluminescent organic material under a first pressure and the second temperature and/or pressure condition includes maintaining the mixture of the compressed fluid solvent and the electroluminescent organic material under a second pressure.

22. The method according to claim 21, wherein controllably depositing the first electroluminescent organic material includes delivering the mixture from the first pressure to a solvent evaporating pressure.

23. The method according to claim 21, wherein controllably depositing the second electroluminescent organic material includes delivering the mixture from the second pressure to a solvent evaporating pressure.

* * * * *